(12) United States Patent
Shen et al.

(10) Patent No.: US 12,320,718 B2
(45) Date of Patent: Jun. 3, 2025

(54) PRESSURE SENSING CIRCUIT BOARD AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Fu-Yun Shen, Shenzhen (CN); Hsiao-Ting Hsu, New Taipei (TW); Ming-Jaan Ho, New Taipei (TW)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 421 days.

(21) Appl. No.: 18/090,397

(22) Filed: Dec. 28, 2022

(65) Prior Publication Data
US 2023/0160764 A1 May 25, 2023

Related U.S. Application Data

(63) Continuation-in-part of application No. PCT/CN2021/101307, filed on Jun. 21, 2021.

(51) Int. Cl.
*G01L 1/22* (2006.01)
(52) U.S. Cl.
CPC .................... *G01L 1/2262* (2013.01)
(58) Field of Classification Search
CPC ...... G01L 1/2262; G01L 1/205; G01L 1/2287
See application file for complete search history.

(56) References Cited

U.S. PATENT DOCUMENTS

| | | | | |
|---|---|---|---|---|
| 7,886,438 B2* | 2/2011 | Ito | ........................ | H05K 3/4691 |
| | | | | 174/262 |
| 9,107,311 B2* | 8/2015 | Shen | ....................... | H05K 1/092 |
| 9,645,027 B2* | 5/2017 | Hayashi | ................ | G01L 9/0042 |
| 10,553,452 B2* | 2/2020 | Hong | ................ | H01L 23/49822 |
| 11,226,252 B2* | 1/2022 | Mehta | ..................... | G01L 1/125 |
| 2006/0180344 A1* | 8/2006 | Ito | ........................ | H05K 3/4691 |
| | | | | 174/262 |
| 2010/0213461 A1* | 8/2010 | Akimoto | .............. | H10D 86/423 |
| | | | | 257/E29.296 |
| 2023/0408349 A1* | 12/2023 | Hsu | ......................... | G01L 1/225 |

FOREIGN PATENT DOCUMENTS

| | | |
|---|---|---|
| CN | 109385013 A | 2/2019 |
| CN | 109640516 A | 4/2019 |
| CN | 209961371 U | 1/2020 |

* cited by examiner

*Primary Examiner* — Freddie Kirkland, III
(74) *Attorney, Agent, or Firm* — ScienBiziP, P.C.

(57) ABSTRACT

A pressure sensing circuit board includes a dielectric layer, a wiring layer, a strain layer, and a protective layer. The wiring layer is on the dielectric layer. The strain layer is on the dielectric layer having the line layer. The protective layer is on the wiring layer and the strain layer. The pressure sensing circuit board includes a first copper area, a second copper area, and a copper free area. The wiring layer is located in the first copper area and the second copper area. A thickness of the line layer in the first copper area is greater than that in the second copper area, and the wiring layer in the second copper area is mesh-shaped. The strain layer is in the copper free zone and connected to the line layer. The protective layer is on the wiring layer in the second copper area and covers the strain layer.

13 Claims, 10 Drawing Sheets

PRESSURE SENSING CIRCUIT BOARD AND METHOD FOR MANUFACTURING THE SAME

FIELD

The disclosure relates to pressure sensing, and more particularly, to a pressure sensing circuit board and a method for manufacturing the pressure sensing circuit board.

BACKGROUND

With the development of intelligent life, intelligent devices are applied in various fields, such as communication, medical treatment, automobile, and industrial control. Such intelligent devices are usually equipped with pressure sensors.

The existing pressure sensors include capacitive pressure sensor, resistance pressure sensor, and piezoelectric ceramic pressure sensor. The capacitive pressure sensor requires high machining accuracy. The resistance pressure sensor has poor linearity and durability. The piezoelectric ceramic pressure sensors require high temperature sintering during fabrication, the fabrication process is difficult, and can only be used to test an instantaneous pressure. Upper and lower surfaces of such pressure sensor need to be supported.

SUMMARY

To overcome the above shortcomings, a pressure sensing circuit board is needed.

In addition, a method for manufacturing the pressure sensing circuit board is needed.

Figure 1:
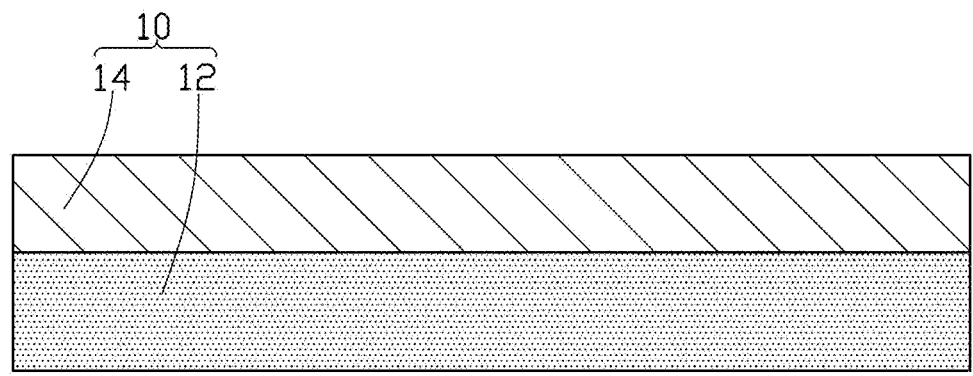
FIG. 1 is a cross-sectional view of a copper-cladding substrate including a dielectric layer and a copper layer according to an embodiment of the present disclosure.

SYMBOL DESCRIPTION OF MAIN COMPONENTS pressure sensing circuit board 100, copper-cladding substrate 10, dielectric layer 12, copper layer 14, wiring layer 145, insulating layer 20, strain layer 30, protective layer 40, first copper area I, second copper area II, copper-free zone III, resistance R1, R2, R3, or Rx.

Many aspects of the disclosure may be better understood with reference to the drawings.

DETAILED DESCRIPTION

Implementations of the disclosure will now be described, by way of embodiments only, with reference to the drawings. It should be noted that non-conflicting details and features in the embodiments of the present disclosure may be combined with each other. Many specific details are described in the following description to facilitate full understanding of the disclosure. The described embodiments are only portions of but not all of the implementation of the disclosure. Based on the embodiments of the disclosure, other embodiments obtained by ordinary skill in the art without creative work belong to the scope of the disclosure.

Unless otherwise defined, all technical terms used herein have the same meaning as commonly understood by one of ordinary skill in the art. The technical terms used herein are only for the purpose of describing specific embodiments, not to be considered as limiting the scope of the embodiments. The term "and/or" used herein includes all or any combination of one or more related listed items.

In the embodiment of the disclosure, in order to facilitate rather than limit the disclosure, the term "connect" used in the specification and the claims, whether direct or indirect, is not limited to physical or mechanical connection. The terms "up", "down", "above", "below", "left", "right", etc. are only used to represent relative position relationships. When the absolute position of the described object changes, the relative position relationship changes accordingly.

Referring to FIGS. 1 to 10, an embodiment of the present disclosure provides a manufacturing method of a pressing sensing circuit board 100, which includes the following steps.

Step S1, referring to FIG. 1, a copper-cladding substrate 10 is provided, which includes a dielectric layer 12 and a copper layer 14 formed on the dielectric layer 12.

The dielectric layer 12 can be rigid or flexible. The dielectric layer 12 may include, but are not limited to, polyimide (PI), polyethylene terephthalate (PET), polyethylene naphthalate-2,6-dicarboxylate (PEN), liquid crystal polymer (LCP), and modified polyimide (MPI).

The copper layer 14 may be on a surface or two opposite surfaces of the dielectric layer 12. In an embodiment, the copper layer 14 is on a surface of the dielectric layer 12.

In some embodiments, an embedded wiring layer (not shown), which is electrically connected to the copper layer 14, may be formed in the dielectric layer 12, so that the pressing sensing circuit board 100 has multilayer wiring layers.

Figure 2:
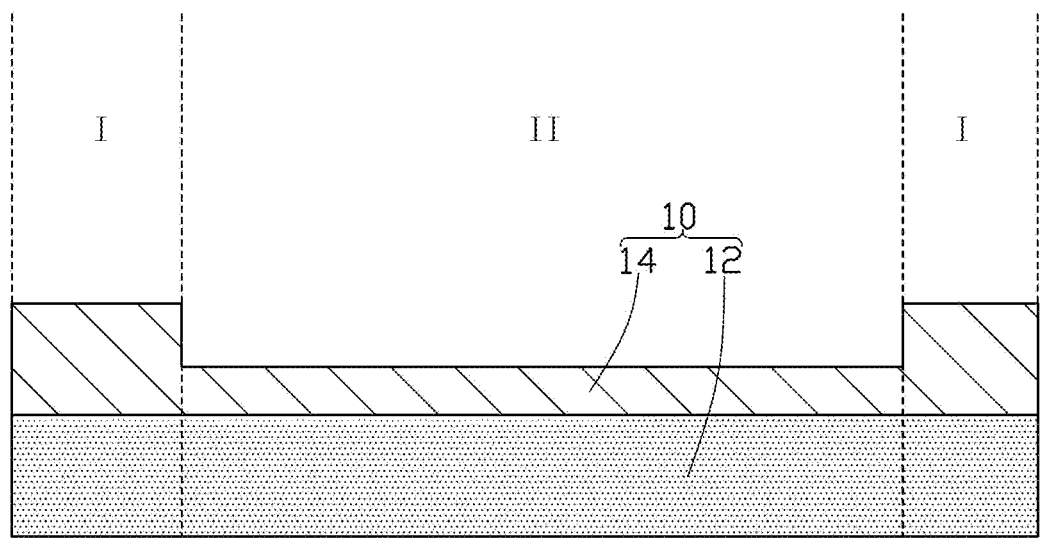
FIG. 2 is a cross-sectional view wherein the copper layer of FIG. 1 is partially etched to form a second copper area and a first copper area.
Figure 3:
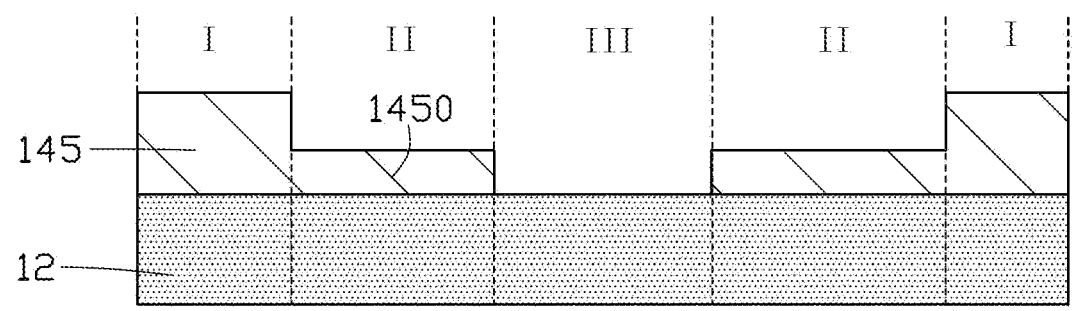
FIG. 3 is a cross-sectional view wherein a copper layer in the second copper area of FIG. 2 is partially removed to form a copper-free area, and wirings are made on the copper layer to form a wiring layer to form a wiring layer.
Figure 4:
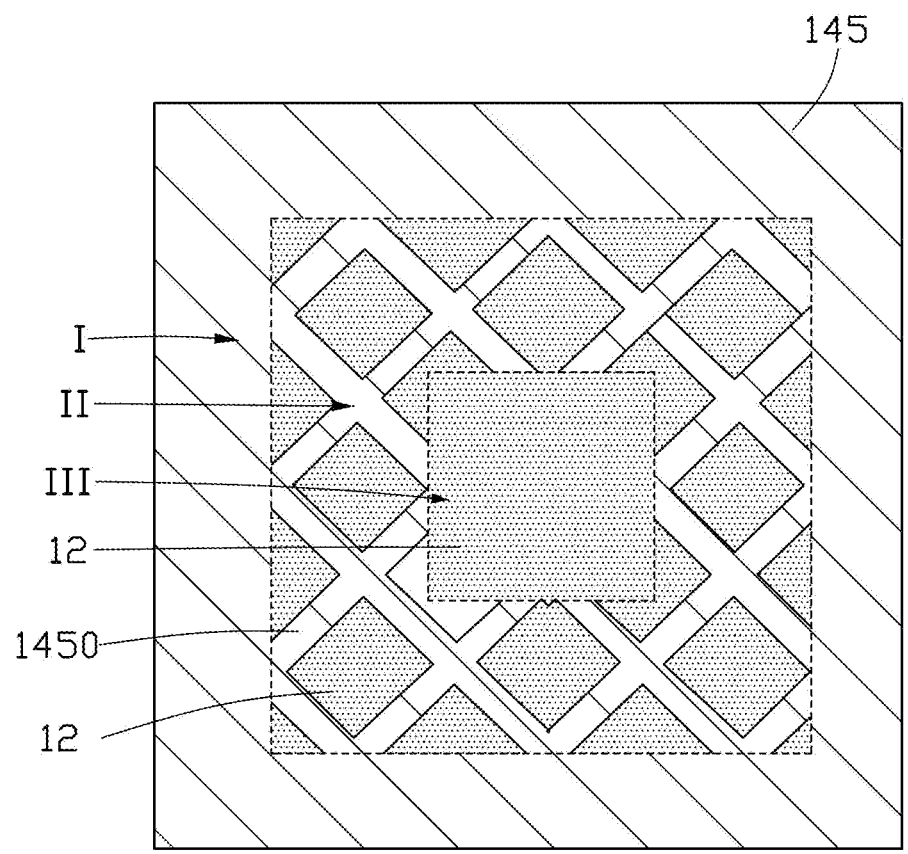
FIG. 4 is a top view of a portion of the wiring layer having mesh-shaped wirings according to an embodiment of the present disclosure.
Figure 5:
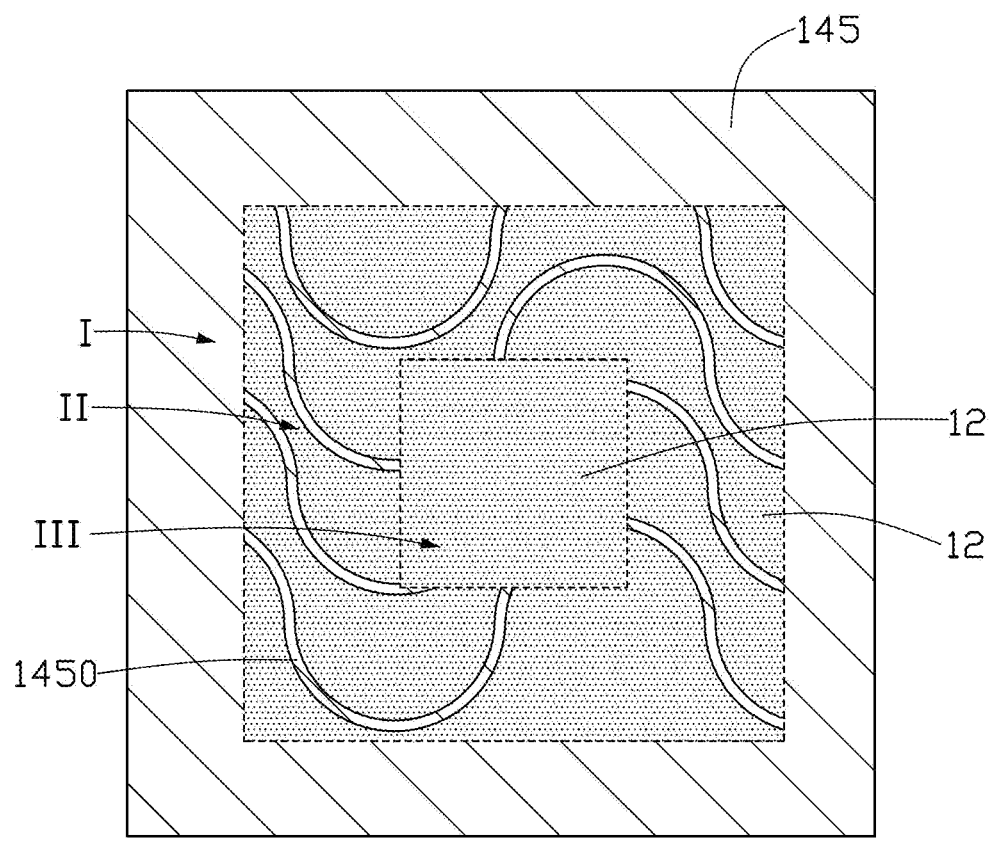
FIG. 5 is a top view of a portion of the wiring layer having corrugated wirings according to another embodiment of the present disclosure.
Figure 6:
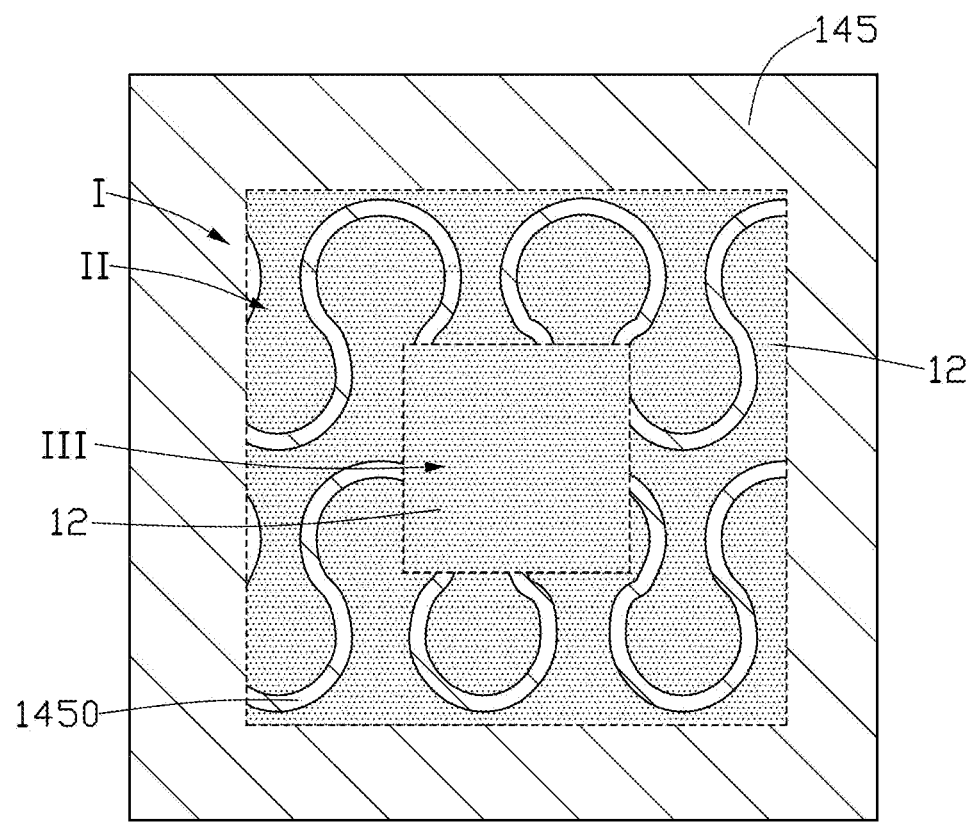
FIG. 6 is a top view of a portion of the wiring layer having horseshoe-shaped wirings according to yet another embodiment of the present disclosure.

Step S2, referring to FIG. 2, the copper layer 14 is partially etched to form a second copper area II and a first copper area I.

After the copper layer 14 is partially etched, a thickness of the copper layer 14 in an area is reduced and a thickness of the copper layer 14 in another area remains unchanged. The area where the thickness of the copper layer 14 is reduced is the second copper area II, and the area where the thickness of the copper layer 14 remains unchanged is the first copper area I.

Step S3, referring to FIGS. 3 to 6, the copper layer 14 in the second copper area II is partially removed to form a copper-free area III, so that the dielectric layer 12 is partially exposed. The copper layer 14 is etched into a wiring layer 145. The wiring layer 145 include a mesh-shaped wiring portion 1450, and a gridding treatment is performed on the remaining copper layer 14 in the second copper area II to form the mesh-shaped wiring portion 1450.

The copper layer 14 is absent on the dielectric layer 12 in the copper-free zone III.

The copper-free area III and the first copper area I are spaced from each other by the second copper area II. The first copper area I, the second copper area II, and the copper-free area III form stepped surfaces. That is, along a stacking direction of the copper layer 14 and the dielectric layer 12, the thickness of the copper layer 14 in the first copper area I is greater than that of the copper layer 14 in the second copper area II.

The gridding treatment is performed on the remaining copper layer 14 in the second copper area II, and the copper layer 14 in the second copper area II is partially etched or removed again to form a mesh shape. In an embodiment, the copper layer 14 in the second copper area II is partially removed to expose the dielectric layer 12.

The wirings of the mesh-shaped wiring portion 1450 formed by the gridding treatment can be connected to or disconnected from each other. The mesh-shaped wiring portion 1450 may include, but not limited to, mesh-shaped wirings crosslinked with each other (see FIG. 4), corrugated wirings not crosslinked with each other (see FIG. 5), and horseshoe-shaped wirings (see FIG. 6). The mesh-shaped wiring portion 1450 is easily deformed under an external force, which improves the strain capacity of the wiring layer 145.

Figure 7:
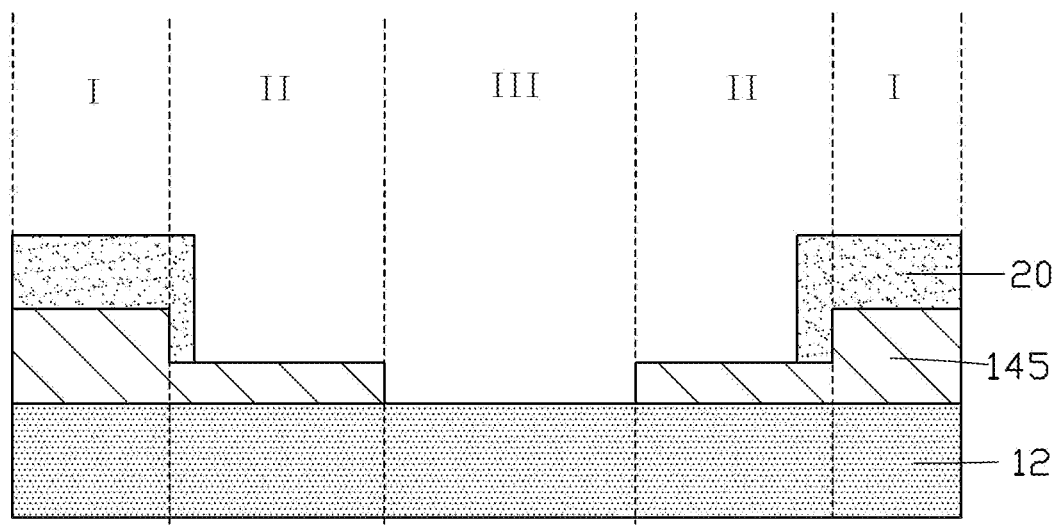
FIG. 7 is a cross-sectional view wherein an insulating layer covers the wiring layer in the first copper area of FIG. 3.

Step S4, referring to FIG. 7, an insulating layer 20 covers the wiring layer 145 in the first copper area I.

The insulating layer 20 can avoid oxidation of the wiring layer 145.

Figure 8:
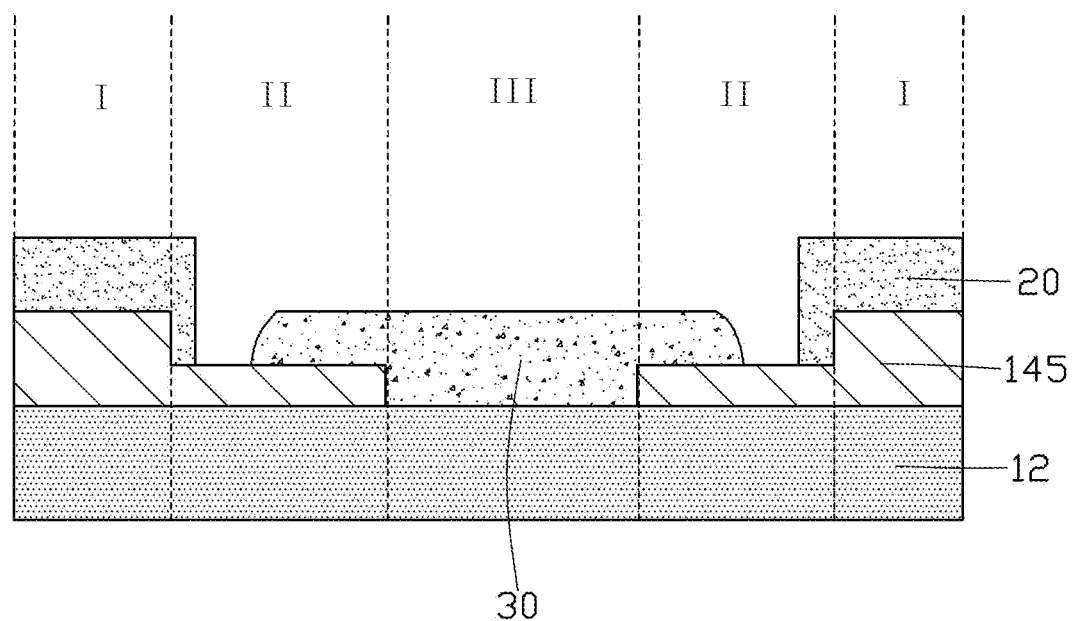
FIG. 8 is a cross-sectional view wherein a strain layer is formed on the dielectric layer in the copper-free zone of FIG. 7.

Step S5, referring to FIG. 8, a strain layer 30 is formed on the dielectric layer 12 of the copper-free zone III.

The strain layer 30 is made of a material that changes the resistance when being deformed under the external force, including but not limited to a metal or a carbon containing conductive resin.

During the process of forming the strain layer 30, a thickness of the strain layer 30 is greater than that of the copper layer 14 in the second copper area II. Due to the fluidity of the strain layer 30, the strain layer 30 also covers a portion of the wiring layer 145 adjacent to the copper-free zone III. Since the strain layer 30 covers at least a portion of the wiring layer 145 in the second copper area II, the strain layer 30 and the wiring layer 145 forms an overlapping structure, which increases a contact area between the strain layer 30 and the wiring layer 145, and also increase connection reliability and avoid poor contact.

In some embodiments, before forming the strain layer 30, a step of forming a treatment layer on the wiring layer 145 is also included, and the treatment layer avoids oxidation of the wiring layer 145.

Figure 9:
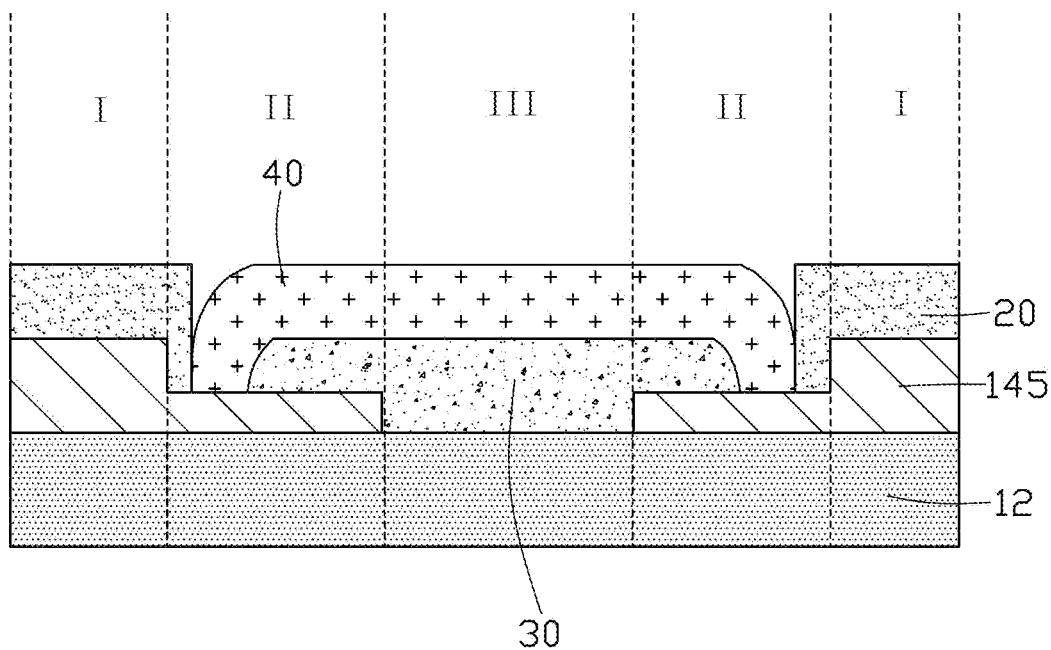
FIG. 9 is a cross-sectional view wherein a protective layer is formed on the wiring layer in the second copper area and the strain layer of FIG. 8, to form a pressure sensing circuit board.

Step S6, referring to FIG. 9, a protective layer 40 is formed on the wiring layer 145 in the second copper area II, and the protective layer 40 also covers the strain layer 30. Then, the pressing sensing circuit board 100 is obtained.

The protective layer 40 is made of an insulating ink layer, and the ink layer has good ductility. The protective layer 40 will not crack under the external force.

In some embodiments, the step of forming the insulating layer 20 may be after the step of forming the strain layer 30 and/or the protective layer 40.

Figure 10:
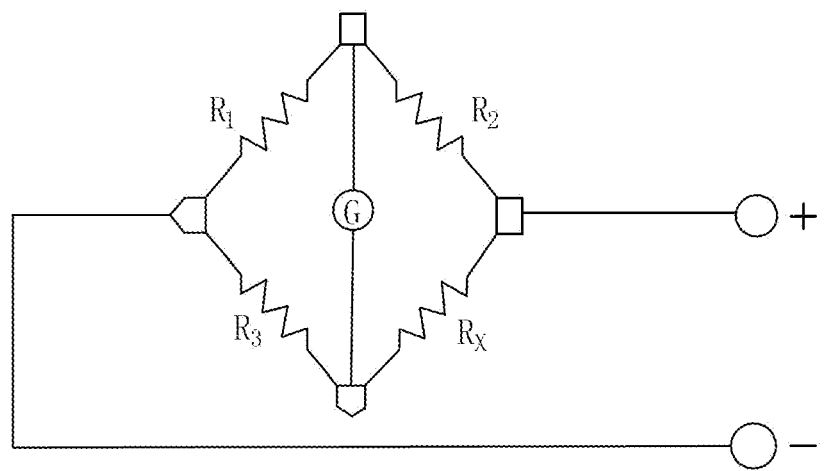
FIG. 10 is a cross-sectional view of a Wheatstone bridge formed by the strain layer according to an embodiment of the present disclosure.

Referring to FIG. 10, the pressing sensing circuit board 100 further includes three resistors R1, R2, and R3 with fixed resistance values. The resistor R1 is connected in series with the resistor R2. The resistor R3 is connected in series with the resistor Rx composed of the strain layer 30. Then, the resistor R1 and the resistor R2 connected in series are further connected in parallel with the resistor R3 and the resistor Rx connected in series, thus forming a Wheatstone bridge. The characteristics of the bridge are used when building the entire circuit loop, so that the pressing sensing circuit board 100 can work more sensitive and effective.

Specifically, when the resistance Rx composed of the strain layer 30 changes, a voltage between two points B and D in the figure also changes. The change of resistance Rx can be calculated by the change of voltage, and the external force applied on the strain layer 30 can also be calculated accordingly.

Referring to FIG. 9, a pressure sensing circuit board 100 is also provided according to an embodiment of the present disclosure, which includes a dielectric layer 12, a wiring layer 145, a strain layer 30, and a protective layer 40. The wiring layer 145 is formed on a surface of the dielectric layer 12. The strain layer 30 is formed on the surface of the dielectric layer 12 having the wiring layer 145. The protective layer 40 is formed on the wiring layer 145 and the strain layer 30.

The pressing sensing circuit board 100 includes a first copper area I, a second copper area II, and a copper-free area III connected in that order. The wiring layer 145 is located in the first copper area I and the second copper area II. Along a stacking direction of the wiring layer 145 and the dielectric layer 12, a thickness of the wiring layer 145 in the first copper area I is greater than that of the wiring layer 145 in the second copper area II. A portion of the wiring layer 145 located in the second copper area II is mesh-shaped. The strain layer 30 is located in the copper-free zone III and connected to the wiring layer 145. The protective layer 40 is located on the wiring layer 145 in the second copper area II and covers the strain layer 30.

When the protective layer 40 is subjected to an external force, the external force is transmitted to the strain layer 30. The strain layer 30 generates strain under the external force, and the resistance of the strain layer 30 changes, thereby changing the resistance of the pressure sensing circuit board 100 in the circuit loop. When the resistance changes, the voltage monitored in the electrical circuit will change, and the value of the external force applied on the strain layer 30 can be calculated according to the change of voltage.

The dielectric layer 12 may be rigid or flexible. The dielectric layer 12 may include, but are not limited to, polyimide (PI), polyethylene terephthalate (PET), polyethylene naphthalene-2,6-dicarboxylate (PEN), liquid crystal polymer (LCP), and modified polyimide (MPI). In some embodiments, the dielectric layer 12 is flexible, so that the pressure sensing circuit board 100 is flexible and can be bent at a suitable position to meet different needs.

The wirings of the mesh-shaped wiring portion 1450 can be connected to or disconnected from each other. The mesh-shaped wiring portion 1450 includes but not limited to at least one of mesh-shaped wirings crosslinked with each other, corrugated wirings not cross-linked with each other, and horseshoe-shaped wirings. The mesh-shaped wiring portion 1450 is easily deformed under the external force, which can improve the strain capacity of the wiring layer 145.

In some embodiments, along the stacking direction of the wiring layer 145 and the dielectric layer 12, the thickness of the strain layer 30 is greater than that of the wiring layer 145 in the second copper area II, so that at least a portion of the strain layer 30 covers a portion of the wiring layer 145 in the second copper area II. That is, the strain layer 30 and the wiring layer 145 forms an overlapping structure, which increases the contact area between the strain layer 30 and the wiring layer 145 and also improves the connection reliability and avoid poor contact.

In some embodiments, the strain layer 30 is further located in the second copper area II and covers a portion of the wiring layer 145 in the second copper area II. The second copper area II and the strain layer 30 form an overlapping structure with the wiring layer 145.

The protective layer 40 is formed on the wiring layer 145 and the strain layer 30. On the one hand, the protective layer 40 can protect the wiring layer 145 and avoid oxidation of the wiring layer 145. On the other hand, the protective layer 40 also has ductility to prevent cracks in the protective layer 40 when the protective layer 40 is subjected to the external force.

In some embodiments, the pressing sensing circuit board 100 further includes an insulating layer 20, which covers the wiring layer 145 in the first copper area I to protect the wiring layer 145.

Referring to FIG. 10, the pressing sensing circuit board 100 further includes three resistors R1, R2, and R3 with fixed resistance values. The resistor R1 is connected in series with the resistor R2. The resistor R3 is connected in series with the resistor Rx composed of the strain layer 30. Then, the resistor R1 and the resistor R2 connected in series are further connected in parallel with the resistor R3 and the resistor Rx connected in series, thus forming a Wheatstone bridge. The characteristics of the bridge are used when building the entire circuit loop, so that the pressing sensing circuit board 100 can work more sensitive and effective.

The pressure sensing circuit board 100 in the present disclosure includes the dielectric layer 12 and the wiring layer 145 and the strain layer 30 formed on the dielectric layer 12. When the strain layer 30 is subjected to the external force, the resistance of the strain layer 30 changes, thereby changing the resistance of the pressure sensing circuit board 100 in the circuit loop. The voltage monitored in the circuit loop then changes. The value of the external force applied on the strain layer 30 can be calculated according to the change of voltage. The resistance of strain layer 30 changes linearly under the external force, and the resistance recovers only when the external force is removed. The external force at any time can be tested, and the linearity is good. The durability of the pressure sensing circuit board 100 is improved by setting the protective layer 40 on the strain layer 30. In the second copper area II of the pressing sensing circuit board 100, the mesh-shaped wiring portion 1450 improves the strain capacity of the wiring layer 145, thereby improving the sensitivity of the pressing sensing circuit board 100. The dielectric layer 12 is arranged on a single surface of the wiring layer 145, the strain layer 30, and the protective layer 40, which simplifies the structure of the pressure sensing circuit board 100. The pressure sensing circuit board 100 also has a simple manufacturing method.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A pressing sensing circuit board, comprising:
   a dielectric layer;
   a wiring layer stacked on the dielectric layer;
   a strain layer stacked on the wiring layer; and
   a protective layer stacked on the wiring layer and the strain layer;
   wherein the pressing sensing circuit board comprises a first copper area, a second copper area, and a copper-free area connected in that order, the wiring layer is located in the first copper area and the second copper area; along a stacking direction of the wiring layer and the dielectric layer, a thickness of the wiring layer in the first copper area is greater than a thickness of the wiring layer in the second copper area, the wiring layer in the second copper area comprises a mesh-shaped wiring portion; the strain layer is located in the copper-free area and connected to the wiring layer; the protective layer is formed on the wiring layer in the second copper area and further covers the strain layer.

2. The pressing sensing circuit board according to claim 1, wherein the mesh-shaped wiring portion comprises mesh-shaped wirings, corrugated wirings, and horseshoe-shaped wirings.

3. The pressure sensing circuit board according to claim 1, wherein along the stacking direction of the wiring layer and the dielectric layer, a thickness of the strain layer is greater than a thickness of the wiring layer in the second copper area.

4. The pressure sensing circuit board according to claim 3, wherein the strain layer is further located in the second copper area and covers a portion of the wiring layer located in the second copper area.

5. The pressure sensing circuit board according to claim 1, further comprising three resistors with fixed resistance values, wherein the three resistors and the strain layer cooperatively form a Wheatstone bridge.

6. The pressing sensing circuit board according to claim 1, further comprising an insulating layer covering the wiring layer in the first copper area.

7. The pressing sensing circuit board according to claim 1, wherein the dielectric layer is flexible.

8. The pressing sensing circuit board according to claim 1, wherein the protective layer comprises an insulating ink.

9. The pressing sensing circuit board according to claim 1, wherein the strain layer comprises a metal or a conductive resin containing carbon.

10. A method for manufacturing a pressing sensing circuit board, comprising:
    providing a copper-cladding substrate, which comprising a dielectric layer and a copper layer stacked on the dielectric layer;
    partially etching the copper layer to form a second copper area and a first copper area;
    partially removing the copper layer in the second copper area to form a copper-free area and to expose a portion of the dielectric layer, etching the copper layer to form a wiring layer, wherein a gridding treatment is further performed on a remaining copper layer in the second copper area to form a mesh-shaped wiring portion;

forming a strain layer on the dielectric layer in the copper-free zone; and forming a protective layer on the wiring layer in the second copper area and further covering the strain layer, thereby obtaining the pressure sensing circuit board.

11. The method according to claim 10, wherein along a stacking direction of the copper layer and the dielectric layer, a thickness of the strain layer is greater than a thickness of the wiring layer in the second copper area.

12. The method according to claim 11, wherein when forming the strain layer, the strain layer further covers the wiring layer adjacent to the copper-free area.

13. The method according to claim 10, wherein after forming the wiring layer, the method further comprising:

forming an insulating layer on the wiring layer in the first copper area.

* * * * *